United States Patent
Matsui et al.

(10) Patent No.: US 7,156,061 B2
(45) Date of Patent: Jan. 2, 2007

(54) VALVE LIFTER

(75) Inventors: Takashi Matsui, Saitama-ken (JP);
Masaki Moronuki, Niigata-ken (JP);
Katsuhiro Tsuji, Niigata-ken (JP);
Yutaka Mabuchi, Kanagawa (JP);
Takahiro Hamada, Kanagawa (JP);
Hiroyuki Izumi, Kanagawa (JP);
Tomoyuki Koike, Tokyo (JP)

(73) Assignees: Kabushiki Kaisha Riken, Tokyo (JP);
Nissan Motor Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/345,606

(22) Filed: Feb. 1, 2006

(65) Prior Publication Data

US 2006/0207540 A1  Sep. 21, 2006

(30) Foreign Application Priority Data

Feb. 2, 2005 (JP) .............................. 2005-026719

(51) Int. Cl.
*F01L 1/14* (2006.01)

(52) U.S. Cl. .............................. 123/90.51; 123/90.48; 74/569

(58) Field of Classification Search ............. 123/90.39, 123/90.44, 90.6, 90.48, 90.51; 74/567, 569; 428/408
See application file for complete search history.

(56) References Cited

U.S. PATENT DOCUMENTS 5,456,136 A * 10/1995 Yamashita et al. ............ 74/569
5,997,988 A * 12/1999 Sada .......................... 428/141

FOREIGN PATENT DOCUMENTS

| JP | 05-163909   | 6/1993  |
| JP | 2002-309912 | 10/2002 |
| JP | 2004-137535 | 5/2004  |

* cited by examiner

*Primary Examiner*—Ching Chang
(74) *Attorney, Agent, or Firm*—Slater & Matsil, L.L.P.

(57) ABSTRACT

A valve lifter, in which an amorphous hard carbon film is coated at least on the surface that slides against a cam, is characterized in that the surface of a base material (substrate) has an arithmetic mean roughness of Ra 0.01 to 0.03 micrometers, and the maximum length of the scratch on the base surface is made to be equal to or shorter than 250 micrometers.

20 Claims, 3 Drawing Sheets

2 Amorphous hard carbon film

1 Valve lifter

2 Amorphous hard carbon film

3 Shim

VALVE LIFTER

This application claims priority to Japanese Patent Application 2005-026719, which was filed Feb. 2, 2005, and is incorporated herein by reference.

TECHNICAL FIELD

This invention relates to a valve lifter coated with a hard film and used for a valve train assembly for internal combustion engines.

BACKGROUND

In improving fuel efficiency and increasing outputs of an internal combustion engine, to reduce friction at sliding portions in its valve train assembly is an effective measure. Therefore, for the purpose of reducing friction at the sliding portion between a valve lifter and a cam, the sliding surface has been coated with a hard film, such as titanium nitride films (e.g., TiN), chromium nitride films (e.g., $Cr_2N$, CrN), or diamond-like carbon (DLC) films.

To reduce friction, it is necessary that the surface roughness of a shim that is located on the top surface of a valve lifter and slides against a cam, should be as small as the thickness of oil film between the cam and the shim or top surface of valve lifter. For example, Japanese Laid-Open JP05-163909A, which is incorporated herein by reference, discloses a structure of cam contact part, in which the surface roughness of a shim is made to have a ten-point mean roughness (Rz) equal to or less than 0.1 micrometers (which corresponds to 0.025 micrometers in terms of Ra), and the surface of the shim (or top surface of valve lifter) base material is coated with a thin film such as TiN, TiC, TiCN, CrN, or DLC. With this structure, the contact surface on the side of the cam that contacts with the shim is smoothed to a mirror-like surface during initial sliding operation. In another example, JP2002-309912A, which is incorporated herein by reference discloses a combination of a shim, a lifter, and a camshaft being excellent in friction characteristics and durability, which prevents cracking and flaking of hard thin films that are inherently less ductile and thus, realizes reliability in durability and low friction coefficient. This is provided by making the surface roughness of a base material, before forming a hard carbon film, such as a DLC film, to be equal to or less than Ra 0.03 micrometers, and by coating the base material with a film whose surface roughness is specified depending on hardness and film thickness.

Among these hard films for coating the surface of sliding portions, DLC films have been studied for practical use because of their high hardness and low friction coefficient, expecting their wear resistant properties and friction reduction in a direct acting valve train system. DLC films have a plurality of types depending on, for example, composition ratio of diamond structure to graphite structure, or content of hydrogen or metal. However, in general, a DLC film means an amorphous hard carbon film. Known methods for forming an amorphous hard carbon film include a CVD (chemical vapor deposition) method, using hydrocarbon gases such as methane or acetylene, and a PVD (physical vapor deposition) method, using graphite or the like as a target.

An amorphous hard carbon film formed by a CVD method contains more hydrogen than the film formed by a PVD method, and thus it is difficult to obtain sufficient adhesion to a ferrous base material due to internal residual stress. Therefore, to obtain better adhesion to the base material, methods for reducing internal stress have been employed by interposing an interlayer consisting of metal or metal and carbide, or by incorporating metal into the amorphous hard carbon film.

On the other hand, an amorphous hard carbon film formed by a PVD method such as a Vacuum Arc Ion Plating method has a characteristic of being substantially hydrogen-free, except for the hydrogen unavoidably contained in general (on the order of a few atomic %). Such a film is considered to have a higher hardness and more excellent wear resistance than the amorphous hard carbon film formed by a CVD method. According to JP2002-309912A and JP2004-137535A, which is incorporated herein by reference, specific characteristics of hydrogen-free amorphous hard carbon films are as follows. Film thickness are 0.33 to 1.90 micrometers, Knoop hardness of the surfaces are 1956 to 4050, and hydrogen content are equal to or less than 0.5 atomic %; and at that time, the hardness of the base materials are HRC 53 to 60 and the surface roughness of the base materials are Ra 0.01 to 0.03 micrometers. In addition, also disclosed is the fact that it is desirable that the surface roughness of the base material be as small as possible, and that, if the surface roughness of the base material is smoothed to on the order of Ra 0.01 micrometers, the surface roughness of the film, after the film is formed, can be on the order of Ra 0.03 micrometers without finishing process.

In JP05-163909A, which is incorporated herein by reference, the sliding portions has a structure, in which a base material whose surface roughness before forming a hard film is made to be equal to or less than Rz 0.1 micrometers and a thin hard film is coated on the base material. However, with this structure, by the time the opposing material is smoothed to be mirror-smooth by sliding, the hard film is ground away. Thus, there is a problem that wear occurs on the sliding surface of the base material after the hard film is ground away.

In JP2002-309912A, which is incorporated herein by reference, the surface roughness of a base material before forming a hard carbon film is made to be equal to or less than Ra 0.03 micrometers. On the base material, a hard thin film whose surface roughness Ry is specified depending on hardness and film thickness, is coated by an Arc Ion Plating method to prevent cracking or flaking. However, when grinding, using a general grindstone or lapping or buffing using liberated grains, is performed on the surface of the base material before forming a hard film, a multiple of unavoidable and continuously extending scratches remain on the surface of the base material due to hard particles of abrasives. Therefore, an amorphous hard carbon film coated on the surface of such a base material suffers from a problem of occurrence or development of flaking that is originated from the scratches on the surface before forming the hard film, even though adhesion to some extent is obtained by metal ion bombardment.

SUMMARY OF THE INVENTION

The present invention is invented to solve these problems, and aims to provide a valve lifter, in which an amorphous hard carbon film is coated on the sliding portions, that has excellent adhesion of the amorphous hard carbon film to the base material and reduces friction.

An object of the present invention is to solve above mentioned problems. As a result of intensive studies on adhesion of the film of a valve lifter, in which an amorphous hard carbon film is formed on a sliding surface, the present inventors found that, by defining the maximum length of continuous scratches existing on the surface of the base material to be the sliding portion, occurrence of flaking that is originated from scratches can be avoided and development of the flaking can be prevented in the case the flaking occurs, and then developed the present invention.

A valve lifter, according to the present invention, in which an amorphous hard carbon film is coated at least on the surface that slides against a cam is characterized in that the surface of a base material (substrate) has an arithmetic mean roughness of Ra 0.01 to 0.03 micrometers, and the maximum length of the scratch on the base surface is made to be equal to or shorter than 250 micrometers.

Under a high pressure sliding condition between a cam and a valve lifter, the critical defect size that causes flaking is considered to be relevant to, directly, the width or depth of scratches, but the mechanism of the flaking of the amorphous hard carbon film originated from scratches on the top surface of the valve lifter has not been found yet. However, by analyzing data focusing on the length of the scratches, inventors found that, if the length of the scratches is equal to or shorter than 250 micrometers, the defect size in the scratches is below the critical value that causes flaking and, if the length of the scratches is longer than 250 micrometers, the defect size in the scratches exceeds the critical value that causes flaking.

The configuration of the valve lifter described above can be preferably applied to at least the surface that slides against a cam. The valve lifter used for the present invention, includes both of the specification, in which a cam and a valve lifter body directly slide and the specification, in which a shim is used between a cam and a valve lifter body. In addition, the scratches on the surface of a base material according to the present invention, are streaks that extend substantially straight and can be recognized with an optical microscope (at 200 times magnification) by observing the surface of the base material before forming a hard film, and "continuous scratches" means scratches that are confirmed to be definitely combined through the observation described above.

In a valve lifter according to the present invention, the arithmetic mean roughness of the surface of the base material before forming a hard carbon film is made to be in a range of Ra 0.01 to 0.03 micrometers. In addition, by making the maximum length of continuous scratches existing on the surface of the base material at the sliding portion to be equal to or less than 250 micrometers by using shot blasting treatment or the like, occurrence of flaking originated from the scratches can be avoided and, in the case the flaking occurs, development of the flaking can be prevented. As a result, adhesion of the amorphous hard carbon film to the surface of the base material can be greatly improved.

An amorphous hard carbon film is effective when directly formed on the surface of a base material, however, formed on an interlayer on the base material is also effective in further reducing the influence of scratches. In viewpoints of hardness and wear resistance, it is preferable that an amorphous hard carbon film is formed by a PVD method, especially an Arc Ion Plating method, and has hydrogen content equal to or less than 0.5 atomic %. Hardness of the film in terms of Knoop hardness (formed on a super hard base material and measured with a load of 50 gf) is made to be equal to or more than Hk 2500 $kg/mm^2$, and more preferably equal to or more than Hk 3000 $kg/mm^2$.

Film thickness of the film, when applied to a valve lifter for a valve train component, is made to be in a range of 0.3 to 1.5 micrometers, and preferably equal to or less than 1.0 micrometer. In addition, from a viewpoint of aggressiveness against a cam, surface roughness of the film is preferably in a range of Ra 0.01 to 0.03 micrometers. As a base material, on which an amorphous hard carbon film as described above is formed, it is preferable to use a steel slab such as SCM415 or ferrous alloy, or said steel slab or ferrous alloy, on which hardening heat treatment such as carburizing treatment or quenching treatment is performed so that their surface hardness are made to be equal to or more than HRC 53. If surface hardness is below HRC 53, there is a possibility that flaking of the amorphous hard carbon film occurs due to deformation of the base material.

According to embodiments of the present invention, occurrence of flaking of an amorphous hard carbon film originated from scratches on the surface of a base material can be avoided, and development of the flaking can be prevented. Thus, a valve lifter having highly reliable adhesion can be obtained and can be manufactured.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

An exemplary embodiment of a valve lifter according to the present invention is described below.

Figure 1:
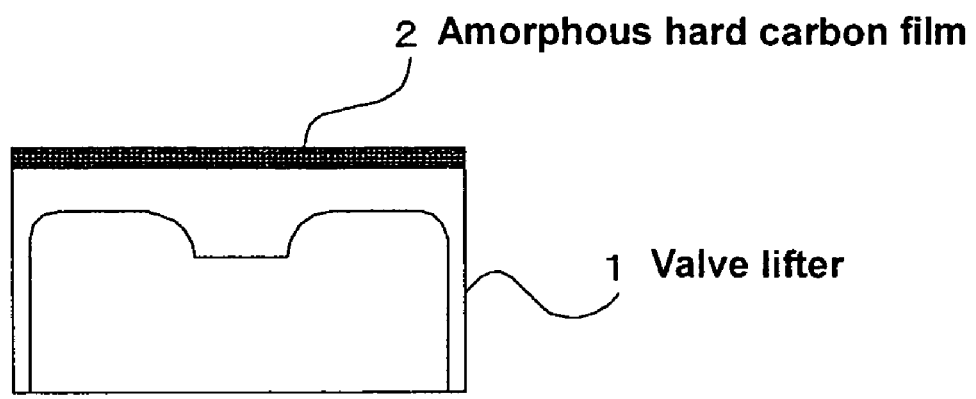
FIG. 1 is an example of a cross sectional view of a valve lifter according to the present invention.
Figure 2:
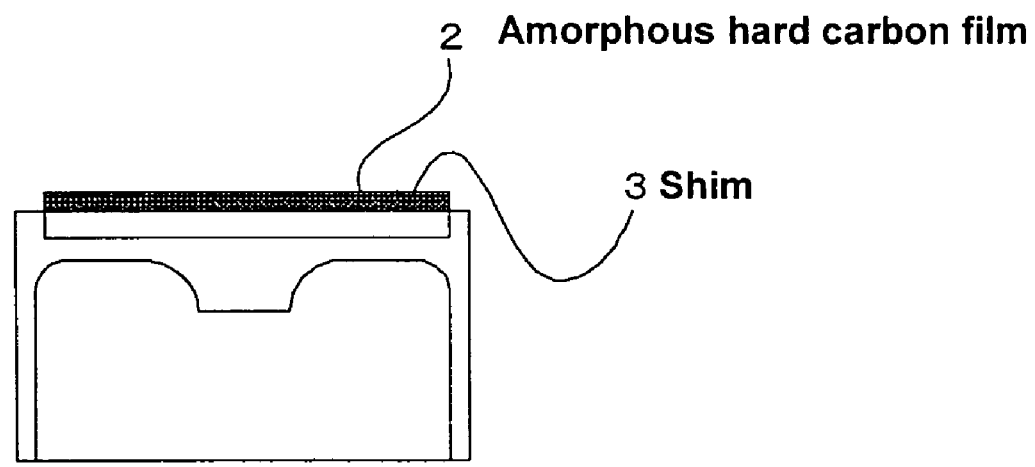
FIG. 2 is an example of a cross sectional view of a valve lifter under a specification that uses a shim according to the present invention.

FIG. 1 and FIG. 2 show examples of cross sectional views of a valve lifter according to the present invention. An amorphous hard carbon film 2 is formed on the top surface of a valve lifter 1 that slides against a cam. For the valve lifter described above, a steel slab, for example, SCM415, is used as a base material of the valve lifter. After the base material is formed by forging, carburizing and quenching is performed, and superfinishing or the like of the top surface is performed in a subsequent process.

FIG. 2 is an example of a cross sectional view of a valve lifer under a specification that uses a shim 3. In this example, the shim 3 is coated with an amorphous hard carbon film 2, as described herein.

Figure 4:
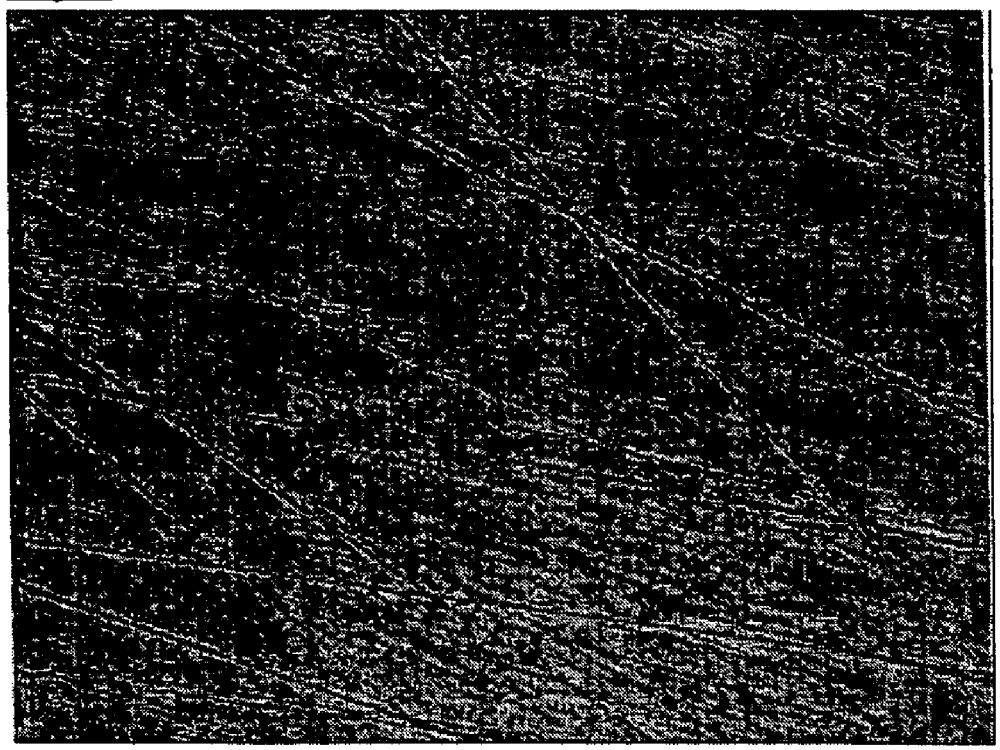
FIG. 4 is a photo image of the surface of a base material of the comparison sample 1 before coated with a film, observed with an optical microscope (200 times magnification)

FIG. 4 is an image of the surface of the top surface portion, on which superfinishing was performed by using a general grindstone, observed with an optical microscope (at 200 times magnification). Surface roughness measured by a stylus-type profilometer was Ra 0.025 micrometers, and it can be observed that a multiple of long, continuous, and crossing scratches due to the grindstone remained.

Figure 5:
FIG. 5 is a photo image of the surface of a base material of the comparison sample 2 before coated with a film, observed with an optical microscope (200 times magnification).

FIG. 5 shows an image of the surface on which, after superfinished, buffing was performed for a predetermined period by using alumina or chromic oxide as abrasives. Surface roughness measured as described above was Ra 0.015 micrometers. Compared with the one on which only superfinishing was performed as described above (FIG. 4), the density of scratches was greatly reduced, however, small amounts of continuous long scratches still remained.

Figure 3:
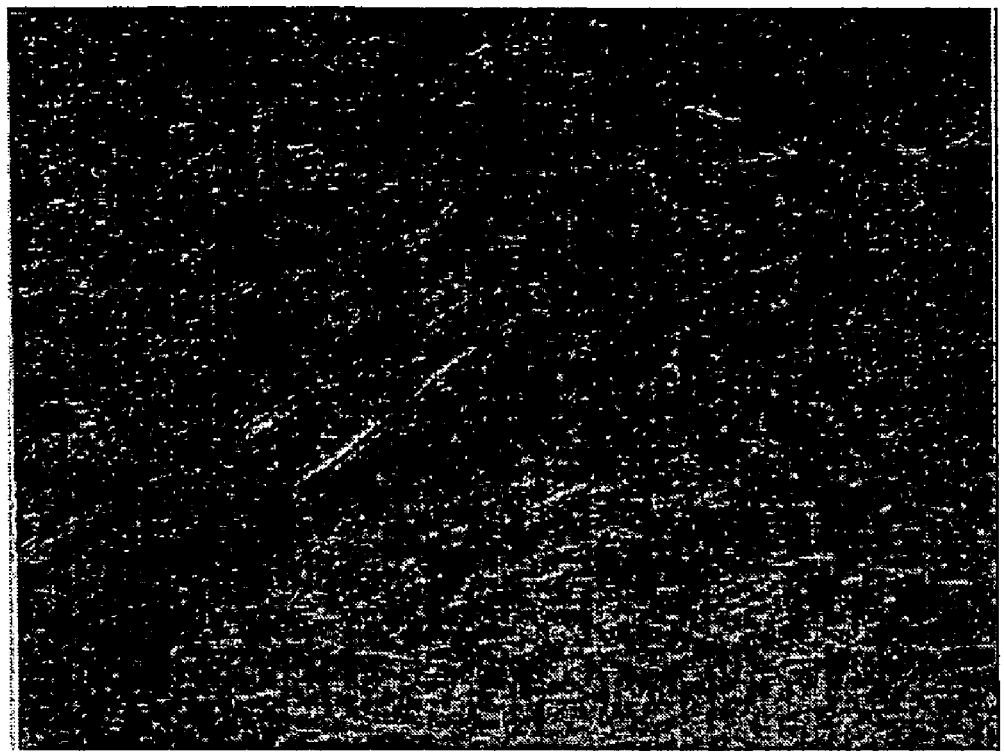
FIG. 3 is a photo image of the surface of a base material of an embodiment before coated with a film, observed with an optical microscope (200 times magnification)

FIG. 3 is an image of the surface on which, after superfinished, shot blasting was performed for a predetermined period using elastic grains as abrasives, observed with an optical microscope. Surface roughness was Ra 0.015 micrometers, and the length of the longest scratch that can be observed was about 200 micrometers.

Samples for embodiments 1 to 3 and comparison samples 1 to 4 were prepared by cleaning valve lifters having these base material surfaces, and forming hydrogen-free amorphous hard carbon films by a Vacuum Arc Ion Plating method. It should be noted that, if the film thickness of the amorphous hard carbon film formed by the Vacuum Arc Ion Plating method is made to be equal to or more than 1.5 micrometers, the surface roughness after the film is coated tends to increase. Because the surface roughness of the surface of the amorphous hard carbon film formed by the Vacuum Arc Ion Plating method became rough and had an arithmetic mean roughness on the order of Ra 0.08 micrometers, the surface roughness was adjusted to a range of Ra 0.01 to 0.03 micrometers in a subsequent processing such as lapping by using abrasive material.

In the process of forming amorphous hard carbon films for the embodiments and comparison samples, the Knoop hardness (measured with a load of 50 gf) of the amorphous hard carbon films formed on a super hard base material was Hk 3000 kg/mm2.

The embodiments 1 to 3 and comparison samples 1 to 4 prepared as described above were evaluated for adhesion of the film to the base material by a pitting durability test. In the pitting test, an apparatus having a structure simulating a real engine was used, and evaluation was performed under the following conditions; revolutions per minute of the cam was 2000 rpm, Hertz stress was 560 MPa, and a testing period was about 90 hours.

Table 1 shows results of the pitting durability test. In the embodiments 1 to 3, in which the maximum lengths of scratches were made to be equal to or less than 250 micrometers by shot blasting, flaking did not occur. Especially in the embodiments 1 and 2, in which elastic grains were used, it was observed that excellent adhesion was obtained.

TABLE I

|  | Finishing method of base material before film coating | Surface roughness before film coating: Ra (μm) | Maximum length of scratch (μm) | Film thickness (μm) | Adhesion |
|---|---|---|---|---|---|
| Embodiment 1 | Superfinishing followed by shot blasting with elastic grains | 0.010 | 50 | 0.7 | Excellent |
| Embodiment 2 | Superfinishing followed by shot blasting with elastic grains | 0.015 | 200 | 0.8 | Excellent |
| Embodiment 3 | Superfinishing followed by shot blasting | 0.025 | 250 | 0.9 | Good |
| Comparison sample 1 | Superfinishing only | 0.025 | Longer than a few mm | 1.0 | Bad |
| Comparison sample 2 | Superfinishing followed by buffing | 0.010 | Longer than a few mm | 0.5 | Not Good |
| Comparison sample 3 | Superfinishing followed by shot blasting with elastic grains | 0.025 | 300 | 0.6 | Not Good |
| Comparison sample 4 | Superfinishing followed by shot blasting | 0.025 | 450 | 0.7 | Not Good |

On the other hand, in the Comparison sample 1, in which an amorphous hard carbon film was coated on the surface of the base material, on which only superfinishing was performed, multiple flaking which seemed to be originated from scratches occurred, and development of the flaking was observed. Also, in the Comparison sample 2, in which buffing using liberated grains was performed after superfinishing, flaking that was originated from scratches occurred as in the case of Comparison sample 1, and part of the flaking developed. It was also observed that adhesion was not good and prevention of flaking development was not sufficient. In the Comparison samples 3 and 4, in which shot blasting was performed by using elastic grains or the like, and the maximum lengths of scratches were made to be equal to or longer than 300 micrometers, flaking was observed in part.

What is claimed is:

1. A valve lifter in which an amorphous hard carbon film is coated at least on a surface sliding against a cam, wherein the surface of a base material has an arithmetic mean roughness in a range of Ra 0.01 to 0.03 micrometers, and a maximum length of scratches on said surface of the base material is equal to or less than 250 micrometers.

2. The valve lifter of claim 1, wherein the surface of the amorphous hard carbon film has an arithmetic mean roughness in a range of Ra 0.01 to 0.03 micrometers.

3. The valve lifter of claim 2, wherein said amorphous hard carbon film has a hydrogen content equal to or less than 0.5 atomic %, a Knoop hardness (Hk) equal to or more than 2500 kg/mm², and a film thickness in a range of 0.3 to 1.5 micrometers.

4. The valve lifter of claim 3, wherein the hardness of the base material on which an amorphous hard carbon film is to be coated is equal to or more than HRC 53.

5. The valve lifter of claim 2, wherein the hardness of the base material on which an amorphous hard carbon film is to be coated is equal to or more than HRC 53.

6. The valve lifter of claim 2, wherein the hardness of the base material on which an amorphous hard carbon film is to be coated is equal to or more than HRC 53.

7. The valve lifter of claim 1, wherein said amorphous hard carbon film has a hydrogen content equal to or less than 0.5 atomic %, a Knoop hardness (Hk) equal to or more than 2500 kg/mm², and a film thickness in a range of 0.3 to 1.5 micrometers.

8. The valve lifter of claim 1, wherein the hardness of the base material on which an amorphous hard carbon film is to be coated is equal to or more than HRC 53.

9. A valve lifter comprising:
a base material having a surface that has an arithmetic mean roughness in a range of Ra 0.01 to 0.03 micrometers and a maximum length of scratches that is equal to or less than 250 micrometers; and
an amorphous hard carbon film coated at least on the surface of the base material, whereby the surface can be configured to slide against a cam.

10. The valve lifter of claim 9, wherein the surface of the amorphous hard carbon film has an arithmetic mean roughness in a range of Ra 0.01 to 0.03 micrometers.

11. The valve lifter of claim 9, wherein said amorphous hard carbon film has a hydrogen content equal to or less than 0.5 atomic %, a Knoop hardness (Hk) equal to or more than 2500 kg/mm², and a film thickness in a range of 0.3 to 1.5 micrometers.

12. The valve lifter of claim 9, wherein the hardness of the base material on which an amorphous hard carbon film is to be coated is equal to or more than HRC 53.

13. The valve lifter of claim 9, wherein said amorphous hard carbon film has a film thickness in a range of 0.3 to 1.5 micrometers.

14. The valve lifter of claim 9, wherein said amorphous hard carbon film has a Knoop hardness (Hk) equal to or more than 2500 kg/mm².

15. The valve lifter of claim 9, wherein said amorphous hard carbon film has a hydrogen content equal to or less than 0.5 atomic %.

16. The valve lifter of claim 9, wherein the surface of the base material comprises a surface of a valve lifter body.

17. The valve lifter of claim 9, further comprising a valve lifter body, wherein the base material comprises a shim disposed over the valve lifter body.

18. A method of making a valve lifter, the method comprising:
providing a valve lifter component;
polishing a surface of the valve lifter component such that the surface has an arithmetic mean roughness in a range of Ra 0.01 to 0.03 micrometers and a maximum length of scratches that is equal to or less than 250 micrometers; and
coating the surface of the valve lifter component with an amorphous hard carbon film.

19. The method of claim 18, wherein providing a valve lifter component comprises providing a valve lifter body and wherein polishing a surface comprises polishing a surface of the valve lifter body.

20. The method of claim 18, wherein providing a valve lifter component comprises providing a shim attached to a valve lifter body and wherein polishing a surface comprises polishing a surface of the shim.

* * * * *